(12) United States Patent
Kim et al.

(10) Patent No.: US 12,517,065 B2
(45) Date of Patent: Jan. 6, 2026

(54) INSPECTION METHOD FOR DISPLAY DEVICE

(71) Applicant: Samsung Display Co., LTD., Yongin-si (KR)

(72) Inventors: Daehong Kim, Yongin-si (KR); Jeongmoon Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 160 days.

(21) Appl. No.: 18/235,406

(22) Filed: Aug. 18, 2023

(65) Prior Publication Data
US 2024/0142391 A1    May 2, 2024

(30) Foreign Application Priority Data
Nov. 1, 2022    (KR) .................. 10-2022-0143828

(51) Int. Cl.
*G01N 21/958* (2006.01)
*G01N 21/33* (2006.01)

(52) U.S. Cl.
CPC ........... *G01N 21/958* (2013.01); *G01N 21/33* (2013.01)

(58) Field of Classification Search
CPC ............ G01N 21/958; G01N 21/33; G01N 2021/8848; G01N 21/95; G01N 21/8422; G01N 2021/9513; H10K 71/70; H10K 50/844
USPC ........................................ 356/369
See application file for complete search history.

(56) References Cited

U.S. PATENT DOCUMENTS

| | | |
|---|---|---|
| 6,201,601 B1 | 3/2001 | Vaez-Iravani et al. |
| 7,304,310 B1 | 12/2007 | Shortt et al. |
| 2017/0263837 A1* | 9/2017 | Jeon ................. H01L 22/12 |
| 2018/0188189 A1* | 7/2018 | Hwang ............... G01N 21/958 |
| 2020/0350513 A1* | 11/2020 | Park ................. H10K 59/8731 |
| 2021/0033930 A1* | 2/2021 | Lee .................. G02F 1/133603 |
| 2021/0376289 A1* | 12/2021 | Lu .................. H10K 50/844 |
| 2022/0093897 A1* | 3/2022 | Lee .................. H10K 59/12 |
| 2022/0165805 A1* | 5/2022 | Choi ................. H10K 71/00 |
| 2022/0199693 A1* | 6/2022 | Wei ................. H10K 59/8723 |
| 2022/0263050 A1* | 8/2022 | Roh ................. H10K 59/122 |
| 2022/0367840 A1* | 11/2022 | Lee ................. H10K 59/8791 |

FOREIGN PATENT DOCUMENTS

| | | | |
|---|---|---|---|
| KR | 20130026079 A | | 3/2013 |
| KR | 101785405 B1 | | 10/2017 |
| KR | 20210109062 A | | 9/2021 |
| KR | 20230013661 A | * | 1/2023 ..... G01N 2021/8816 |

* cited by examiner

*Primary Examiner* — Md M Rahman
(74) *Attorney, Agent, or Firm* — CANTOR COLBURN LLP

(57) ABSTRACT

An inspection method for a display device includes radiating a first light including a light of a radiation wavelength range to a first dam region located in a non-display region of the display device located outside a display region of the display device, receiving a second light reflected from the first dam region, and analyzing the radiation wavelength range of the second light to inspect an organic encapsulation layer remaining in the first dam region after etching the organic encapsulation layer.

20 Claims, 12 Drawing Sheets

INSPECTION METHOD FOR DISPLAY DEVICE

This application claims priority to Korean Patent Application No. 10-2022-0143828, filed on Nov. 1, 2022, and all the benefits accruing therefrom under 35 U.S.C. § 119, the content of which in its entirety is herein incorporated by reference.

BACKGROUND

1. Field

Embodiments of the invention relate to an inspection method for a display device. More particularly, embodiments of the invention relate to an inspection method for a display device using a light.

2. Description of the Related Art

Flat panel display devices are replacing cathode ray tube display devices as display devices due to desirable characteristics such as lightweight and thin characteristics. As representative examples of such flat panel display devices, there are liquid crystal display devices and organic light emitting diode display devices.

A display device may include a display region and a non-display region, and a light emitting element that generates a light may be disposed in the display region. The display device may include an encapsulation layer that encapsulates the display region to protect the light emitting element. The encapsulation layer may include at least one inorganic encapsulation layer and at least one organic encapsulation layer.

SUMMARY

In a display device where an encapsulation layer thereof includes at least one inorganic encapsulation layer and at least one organic encapsulation layer, the organic encapsulation layer may be formed using an organic material such as a monomer. When the organic encapsulation layer is formed, if a relatively large amount of the organic material overflows to an edge of a display region, a defect may occur in the display device.

Embodiments of the invention provide an inspection method for a display device inspecting an organic encapsulation layer.

According to embodiments of the invention, an inspection method for a display device includes radiating a first light including a light of a radiation wavelength range to a first dam region located in a non-display region of the display device located outside a display region of the display device, receiving a second light reflected from the first dam region, and analyzing the radiation wavelength range of the second light to inspect an organic encapsulation layer remaining in the first dam region after etching the organic encapsulation layer.

In an embodiment, the radiation wavelength range may be about 290 nanometers (nm) or greater.

In an embodiment, the radiation wavelength range may be about 410 nm or less.

In an embodiment, the first light may be radiated at an inclination angle of about 15° or less.

In an embodiment, the first light may be radiated at an inclination angle of about 100 or greater.

In an embodiment, the first light may be radiated after the organic encapsulation layer is etched, the organic encapsulation layer may be etched after being formed on a first inorganic encapsulation layer, the first inorganic encapsulation layer may be formed on a first dam and a light emitting element, the first dam may be spaced from an organic insulating layer and be formed in the first dam region, and the light emitting element may be formed on the organic insulating layer.

In an embodiment, the first light may be radiated after a second inorganic encapsulation layer is formed on the organic encapsulation layer, the organic encapsulation layer may be etched after being formed on a first inorganic encapsulation layer, the second inorganic encapsulation layer may be formed on the first inorganic encapsulation layer in the first dam region, the first inorganic encapsulation layer may be formed on a first dam and a light emitting element, the first dam may be spaced from an organic insulating layer and be formed in the first dam region, and the light emitting element may be formed on the organic insulating layer.

In an embodiment, the first light may be a polarized light.

In an embodiment, the inspection method may further include radiating the first light to a second dam region spaced from the first dam region, receiving a third light reflected from the second dam region, and analyzing the radiation wavelength range of the third light to inspect the organic encapsulation layer remaining in the second dam region after etching the organic encapsulation layer.

In an embodiment, the first light may be radiated after the organic encapsulation layer is etched, the organic encapsulation layer may be etched after being formed on a first inorganic encapsulation layer, the first inorganic encapsulation layer may be formed on a first dam, a second dam spaced from the first dam, and a light emitting element, the first dam may be spaced from an organic insulating layer and be formed in the first dam region, and the light emitting element may be formed on the organic insulating layer.

In an embodiment, the first light may be radiated after a second inorganic encapsulation layer is formed on the organic encapsulation layer, the organic encapsulation layer may be etched after being formed on a first inorganic encapsulation layer, the second inorganic encapsulation layer may be formed on the first inorganic encapsulation layer in the first dam region and the second dam region, the first inorganic encapsulation layer may be formed on a first dam, a second dam spaced from the first dam, and a light emitting element, the first dam may be spaced from an organic insulating layer and be formed in the first dam region, and the light emitting element may be formed on the organic insulating layer.

According to embodiments of the invention, an inspection method for a display device may include radiating a first light including a light of a radiation wavelength range to a first dam region located in a camera region of the display device located inside a display region of the display device, receiving a second light reflected from in the first dam region, and analyzing the radiation wavelength range of the second light to inspect an organic encapsulation layer remaining in the first dam region after etching the organic encapsulation layer.

In an embodiment, the radiation wavelength range may be about 290 nm or greater.

In an embodiment, the radiation wavelength range may be about 410 nm or less.

In an embodiment, the first light may be radiated at an inclination angle of about 15° or less.

In an embodiment, the first light may be radiated at an inclination angle of about 100 or greater.

In an embodiment, the first light may be radiated after the organic encapsulation layer is etched, the organic encapsulation layer may be etched after being formed on a first inorganic encapsulation layer, the first inorganic encapsulation layer may be formed on a first dam and a light emitting element, the first dam may be spaced from an organic insulating layer and be formed in the first dam region, and the light emitting element may be formed on the organic insulating layer.

In an embodiment, the first light may be radiated after a second inorganic encapsulation layer is formed on the organic encapsulation layer, the organic encapsulation layer may be etched after being formed on a first inorganic encapsulation layer, the second inorganic encapsulation layer may be formed on the first inorganic encapsulation layer in the first dam region, the first inorganic encapsulation layer may be formed on a first dam and a light emitting element, the first dam may be spaced from an organic insulating layer and may be formed in the first dam region, and the light emitting element may be formed on the organic insulating layer.

In an embodiment, the first light may be a polarized light.

In an embodiment, the inspection method may further include radiating the first light to a second dam region spaced from the first dam region, receiving a third light reflected the second dam region, and analyzing the radiation wavelength range of the third light to inspect the organic encapsulation layer remaining in the second dam region after etching the organic encapsulation layer.

In such embodiments, the inspection method for the display device may inspect whether or not an organic encapsulation layer remains on a top surface of a dam by radiating a first light including a light of an radiation wavelength range to a first dam region located in a non-display region located outside a display region, receiving a second light reflected from the first dam region, and analyzing the radiation wavelength range of the second light to inspect the organic encapsulation layer remaining in the first dam region after etching the organic encapsulation layer. Accordingly, reliability of the display device may be improved.

DETAILED DESCRIPTION

Figure 1:
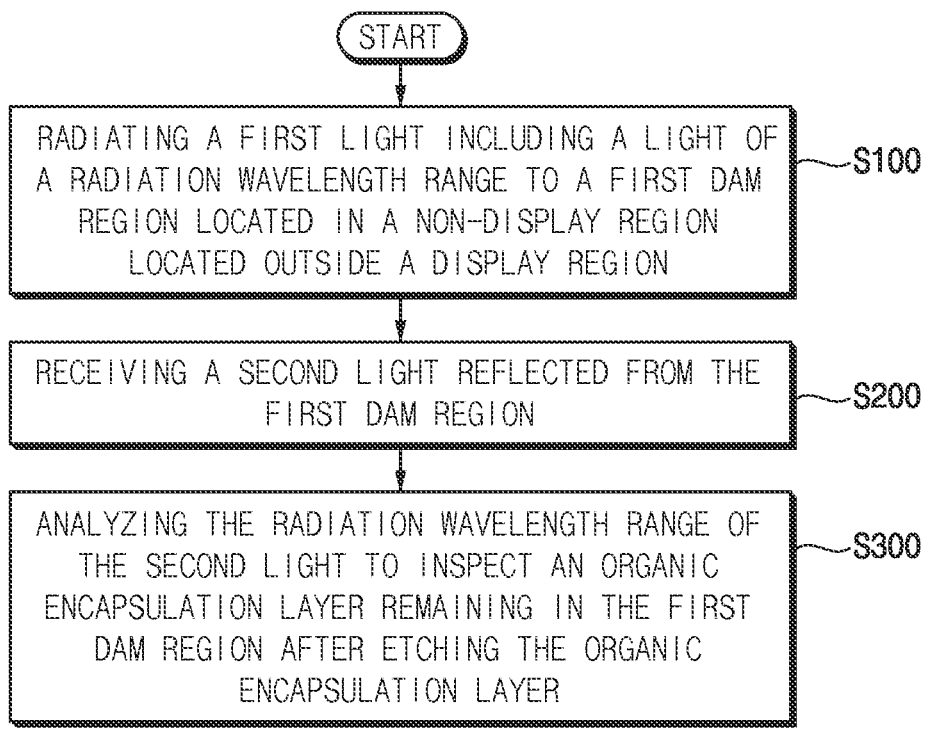
FIG. 1 is a flowchart illustrating an inspection method for a display device according to embodiments of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a flowchart illustrating an inspection method for a display device according to embodiments of the invention.

Referring to FIG. 1, an embodiment of the inspection method for a display device may include radiating a first light including a light of an radiation wavelength range to a first dam region located in a non-display region outside a display region (S100), receiving a second light reflected from the first dam region (S200), and analyzing the radiation wavelength range of the second light to inspect an organic encapsulation layer remaining in the first dam region after etching the organic encapsulation layer (S300).

In an embodiment, the inspection method may further include radiating the first light to a second dam region spaced from the first dam region, receiving a third light reflected from the second dam region, and analyzing the radiation wavelength range of the third light to inspect the organic encapsulation layer remaining in the second dam region after etching the organic encapsulation layer.

In such an embodiment, the inspection method may inspect the organic encapsulation layer remaining in the first dam region and/or the second dam region. Such an embodiment will hereinafter be described in greater detail with reference to FIGS. 2 to 9 below.

Figure 2:
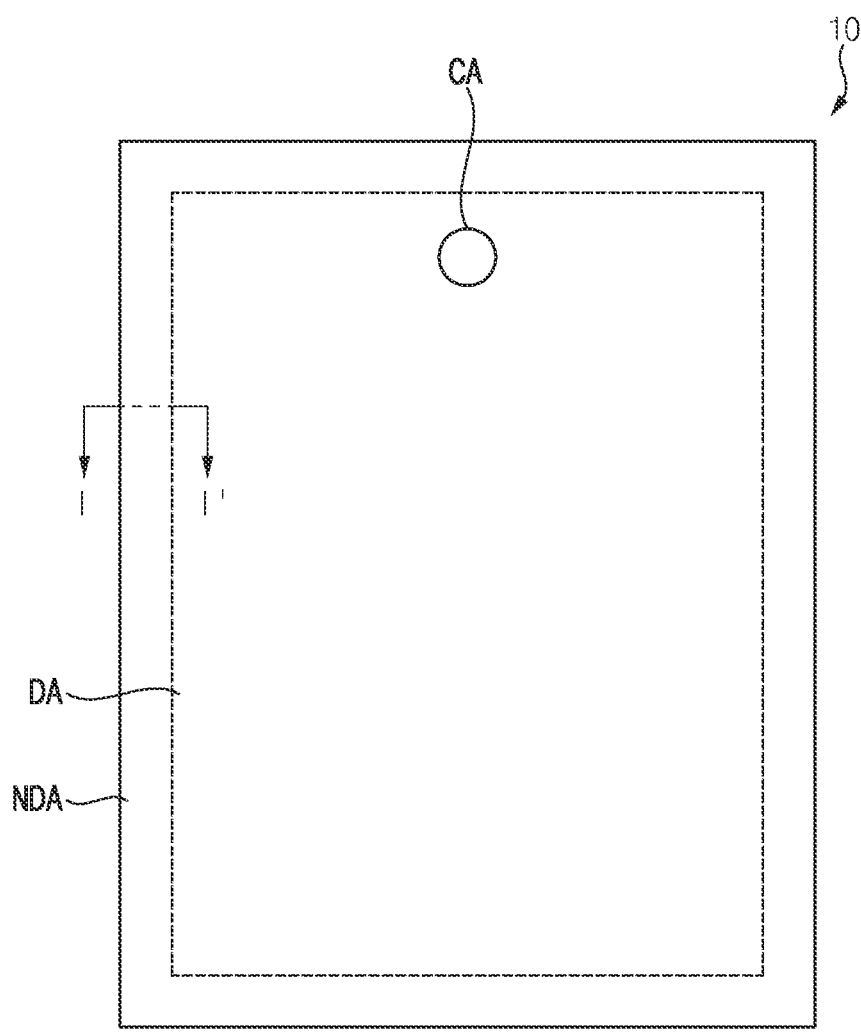
FIG. 2 is a plan view illustrating an embodiment of a display device subject to the inspection method of FIG. 1.

FIG. 2 is a plan view illustrating an embodiment of a display device subject to the inspection method of FIG. 1.

Referring to FIG. 2, an embodiment of the display device 10 may include a display region DA and a non-display region NDA. An image may be displayed in the display region DA. In an embodiment, for example, the non-display region NDA may be located outside the display region DA. In an embodiment, for example, the non-display region NDA may have a shape surrounding the display region DA on a plan view.

The display device 10 may include a camera region CA. An optical module may be disposed under the camera region CA. The optical module may mean a module utilizing optics. In an embodiment, for example, the optical module may include a camera module, an iris recognition module, an optical fingerprint recognition module, an infrared module, or the like.

The plurality of pixels may be disposed in the display region DA. In an embodiment, for example, the pixels may be arranged in a matrix form along a first direction DR1 and a second direction DR2 crossing the first direction DR1. In an embodiment, for example, the second direction DR2 may be perpendicular to the first direction DR1. In FIG. 2, a third direction DR3 may be a direction perpendicular to a plane defined by the first direction DR1 and the second direction DR2, or a thickness direction of the display device 10. Each of the pixels may include a transistor and a light emitting element. The light emitting element may generate light. In an embodiment, the light emitting element may include an organic light emitting diode. In an alternative embodiment, the light emitting element may include a nano light emitting diode.

Figure 3:
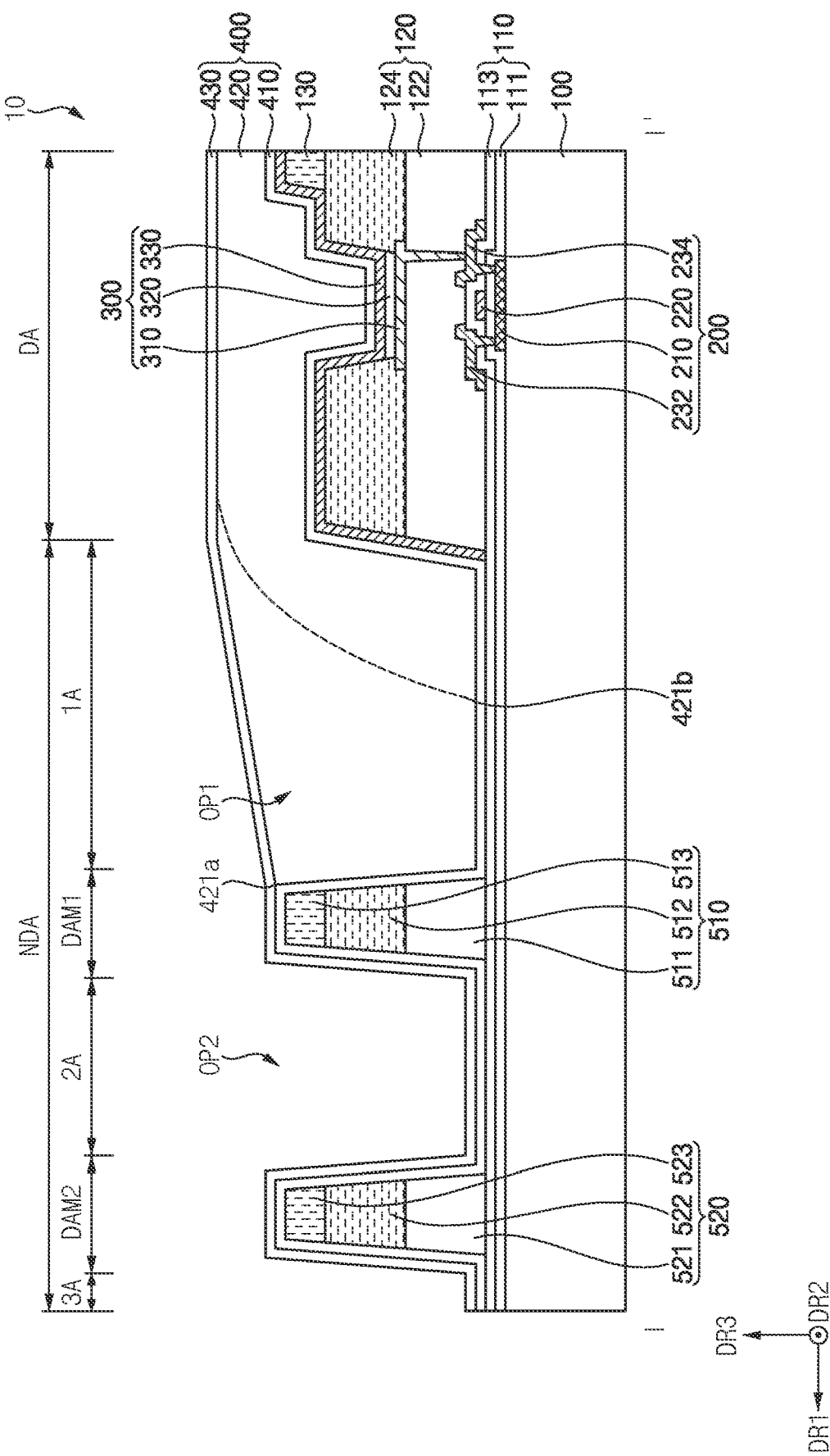
FIG. 3 is a cross-sectional view taken along line I-I' of FIG. 2.

FIG. 3 is a cross-sectional view taken along line I-I' of FIG. 2.

Referring to FIGS. 2 and 3, in an embodiment, the display device 10 may include a substrate 100, a transistor 200, a gate insulating layer 111, an interlayer insulating layer 113, a first organic insulating layer 122, a second organic insulating layer 124, a light emitting element. 300, an encapsulation layer 400, a first dam 510, and a second dam 520. For example, the transistor 200 may include an active layer 210, a gate electrode 220, a source electrode 232, and a drain electrode 234. In an embodiment, for example, the light emitting element 300 may include a pixel electrode 310, a light emitting layer 320, and a common electrode 330. In an embodiment, for example, the encapsulation layer 400 may include a first inorganic encapsulation layer 410, an organic encapsulation layer 420, and a second inorganic encapsulation layer 430.

The substrate 100 may be a transparent insulating substrate. In an embodiment, the substrate 100 may be a flexible substrate including plastic or the like. In an embodiment, for example, the substrate 100 may be a polyimide (PI) substrate. The polyimide substrate may include a first polyimide layer, a barrier film layer, and a second polyimide layer. In an alternative embodiment, the substrate 100 may include a quartz substrate, a synthetic quartz substrate, a calcium fluoride substrate, an F-doped quartz substrate, and a sodalime glass substrate, a non-alkali glass substrate, or the like.

The substrate 100 may include a display region DA and a non-display region NDA. In an embodiment, the non-display region NDA may include a first region TA, a first dam region DAM1, a second region 2A, a second dam region DAM2, and a third region 3A. The first dam region DAM1 may be located outside the display region DA and may be spaced from the display region DA. The second dam region DAM2 may be located outside the first dam region DAM1 and may be spaced from the first dam region DAM1. The first region 1A may be located between the display region DA and the first dam region DAM1. The second region 2A may be located between the first dam region DAM1 and the second dam region DAM2. The third region 3A may be located outside the second dam region DAM2.

In an embodiment, as shown in FIG. 3, the outside of the display region DA may mean a side in the first direction DR1. That is, the first dam region DAM1 may be spaced from the display region DA in the first direction DR1, and the second dam region DAM2 may be spaced from the first dam region DAM1 in the first direction DR1.

The active layer 210 may be disposed in the display region DA on the substrate 100. In an embodiment, for example, the active layer 210 may include a silicon semiconductor or an oxide semiconductor. The silicon semiconductor may include amorphous silicon, polycrystalline silicon, or the like. The active layer 210 may include a source region, a drain region, and a channel region. Impurities may be doped into the source region and the drain region. The channel region may be disposed between the source region and the drain region.

In an embodiment, although not shown in the FIG. 3, a buffer layer may be disposed between the substrate 100 and the active layer 210. That is, the active layer 210 may be disposed in the display region DA on the buffer layer. The buffer layer may prevent diffusion of impurities from the substrate 100 into the active layer 210. In an embodiment, for example, the buffer layer may include an inorganic insulating material such as silicon oxide (SiOx), silicon nitride (SiNx), titanium oxide (TiOx), or tantalum oxide (TaOx).

The gate insulating layer 111 may be disposed on the substrate 100. In an embodiment, for example, the gate insulating layer 111 may be entirely disposed in the display region DA and the non-display region NDA on the substrate 100. The gate insulating layer 111 disposed in the display region DA may cover the active layer 210 on the substrate 100. In an embodiment, for example, the gate insulating layer 111 may include the inorganic insulating material.

The gate electrode 220 may be disposed in the display region DA on the gate insulating layer 111. The gate electrode 220 may overlap the channel region of the active layer 210. The gate electrode 220 may include a metal, an alloy, a conductive metal oxide, a conductive metal nitride, a transparent conductive material, or the like. In an embodiment, for example, the gate electrode 220 may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), Scandium (Sc), indium tin oxide (ITO), indium zinc oxide (IZO), or the like.

The interlayer insulating layer 113 may be disposed on the gate insulating layer 111. In an embodiment, for example, the interlayer insulating layer 113 may be entirely disposed in the display region DA and the non-display region NDA on the gate insulating layer 111. The interlayer insulating layer 113 disposed in the display region DA may cover the gate electrode 220 on the gate insulating layer 111. In an embodiment, for example, the interlayer insulating layer 113 may include the inorganic insulating material.

The buffer layer, the gate insulating layer 111, and the interlayer insulating layer 113 may be referred to as an inorganic insulating layer 110. The inorganic insulating layer 110 may be entirely disposed in the display region DA and the non-display region NDA between the substrate 100 and the first organic insulation layer 122.

The source electrode 232 and the drain electrode 234 may be disposed in the display region DA on the interlayer insulating layer 113. The source electrode 232 and the drain electrode 234 may be connected to the source region and the drain region of the active layer 210, respectively. The source electrode 232 and the drain electrode 234 may include a metal, an alloy, a conductive metal oxide, a conductive metal nitride, a transparent conductive material, or the like. The active layer 210, the gate electrode 220, the source electrode 232, and the drain electrode 234 may form or collectively defined the transistor 200. That is, the transistor 200 may be disposed in the display region DA on the substrate 100.

The first organic insulating layer 122 may be disposed in the display region DA on the interlayer insulating layer 113 and may cover the transistor 200. In an embodiment, for example, the first organic insulating layer 122 may be a planarization layer. The first organic insulating layer 122 may cover the source electrode 232 and the drain electrode 234 on the interlayer insulating layer 113. The first organic insulating layer 122 may create a step around the source electrode 232 and the drain electrode 234 and may have a substantially flat top surface. The first organic insulating layer 122 may include an organic insulating material. In an embodiment, for example, the first organic insulating layer 122 may include photoresist, polyacryl-based resin, polyimide-based resin, polyamide-based resin, siloxane-based resin, acrylic-based resin, epoxy-based resin, or the like.

The pixel electrode 310 may be disposed in the display region DA on the first organic insulating layer 122. The pixel electrode 310 may be connected to the source electrode 232 or the drain electrode 234. That is, the pixel electrode 310 may be disposed on the transistor 200 and electrically connected to the transistor 200. The pixel electrode 310 may include a metal, an alloy, a conductive metal nitride, a transparent conductive material, or the like.

The second organic insulating layer 124 may be disposed in the display region DA on the first organic insulating layer 122. In an embodiment, for example, the second organic insulating layer 124 may be a pixel defined layer. The second organic insulating layer 124 may partially cover the pixel electrode 310 on the first organic insulating layer 122. The second organic insulating layer 124 may be provided with a pixel opening defined therethrough to expose at least a portion of the pixel electrode 310. In an embodiment, for example, the pixel opening may expose a central portion of the pixel electrode 310 and the second organic insulating layer 124 may cover a peripheral region of the pixel electrode 310. The second organic insulating layer 124 may include the organic insulating material.

The first organic insulating layer 122 and the second organic insulating layer 124 may be referred to as an organic insulating layer 120.

The light emitting layer 320 may be disposed on the pixel electrode 310 exposed by the pixel opening. That is, the light emitting layer 320 may be disposed within the pixel opening. The light emitting layer 320 may be disposed between the pixel electrode 310 and the common electrode 330. The light emitting layer 320 may include at least one of an organic light emitting material and quantum dots.

In an embodiment, the organic light emitting material may include a low molecular organic compound or a high molecular organic compound. In an embodiment, for example, the low molecular weight organic compound may include copper phthalocyanine, N,N'-diphenylbenzidine, tris-(8-hydroxyquinoline)aluminum, or the like. The high molecular organic compound may include poly(3,4-ethylenedioxythiophene), polyaniline, poly-phenylenevinylene, polyfluorene, or the like.

The common electrode 330 may be disposed on the light emitting layer 320 and may overlap the pixel electrode 310. In an embodiment, the common electrode 330 may be entirely disposed in the display region DA and the non-display region NDA on the second organic insulating layer 124. In an alternative embodiment, the common electrode 330 may be disposed only in the display region DA on the second organic insulating layer 124. The common electrode 330 may include a metal, an alloy, a conductive metal oxide, a conductive metal nitride, a transparent conductive material, or the like.

The pixel electrode 310, the light emitting layer 320, and the common electrode 330 may form the light emitting element 300. The light emitting element 300 may be disposed on the first organic insulating layer 122.

In an embodiment, a spacer 130 may be disposed in the display region DA on the second organic insulating layer 124. The spacer 130 may maintain a separation distance between a mask (not shown) and the substrate 100 when the light emitting layer 320 is formed. Accordingly, the spacer 130 may prevent a defect in that the light emitting layer 320 is stamped or torn by the mask.

The spacer 130 may include or be formed of the same or similar material as the second organic insulating layer 124. In an embodiment, for example, the second organic insulating layer 124 and the spacer 130 are formed using a halftone mask, such that the second organic insulating layer 124 and the spacer 130 may be substantially simultaneously formed to have different heights from each other using a same material.

The first dam 510 and the second dam 520 may be disposed in the non-display region NDA on the substrate 100. In an embodiment where the first dam 510 and the second dam 520 form the organic encapsulation layer 420 using an organic material such as a monomer, over flow of the organic material toward an edge (e.g., the first direction DR1 in FIG. 3) of the substrate 100 may be effectively prevented.

In an embodiment, for example, the first dam 510 may be disposed in the first dam region DAM1 on the interlayer insulating layer 113. That is, the first dam 510 may be spaced from the organic insulating layer 120 in the first direction DR1.

In an embodiment, for example, the second dam 520 may be disposed in the second dam region DAM2 on the interlayer insulating layer 113. That is, the second dam 520 may be located outside the first dam 510 and may be spaced from the first dam 510 in the first direction DR1.

In an embodiment, each of the first dam 510 and the second dam 520 may have a multilayer structure in which a plurality of layers are stacked one on another. In an embodiment, for example, each of the first dam 510 and the second dam 520 may include a first layer 511 or 521, a second layer 512 or 522, and a third layer 513 or 523, respectively. In an embodiment, for example, the first layers 511 and 521 may be formed substantially simultaneously with the first organic insulating layer 122. The second layers 512 and 522 may be formed substantially simultaneously with the second organic insulating layer 124. The third layers 513 and 523 may be formed substantially simultaneously with the spacer 130. However, this is merely exemplary, and the invention is not limited thereto.

In an embodiment, a first opening OP1 may be defined or formed between the organic insulating layer 120 and the first dam 510. That is, the first opening OP1 may be defined as a space in which the first dam 510 is spaced from the organic insulating layer 120. The first opening OP1 may overlap the first region 1A.

A second opening OP2 may be defined or formed between the first dam 510 and the second dam 520. That is, the second opening OP2 may be defined as a space in which the second dam 520 is spaced from the first dam 510. The second opening OP2 may overlap the second region 2A.

The encapsulation layer 400 may be disposed on the common electrode 330. The encapsulation layer 400 may cover the light emitting element 300. The encapsulation layer 400 may encapsulate the display region DA to protect the light emitting element 300 from external impurities.

The encapsulation layer 400 may include at least one inorganic encapsulation layer and at least one organic encapsulation layer. In an embodiment, for example, the encapsulation layer 400 may include a first inorganic encapsulation layer 410, an organic encapsulation layer 420, and a second inorganic encapsulation layer 430.

The first inorganic encapsulation layer 410 may be disposed on the common electrode 330. In an embodiment, for example, the first inorganic encapsulation layer 410 may have a substantially uniform thickness along a profile of the common electrode 330.

In an embodiment, the first inorganic encapsulation layer 410 and the second inorganic encapsulation layer 430 may be entirely disposed in the display region DA and the non-display region NDA on the substrate 100. That is, the first inorganic encapsulation layer 410 and the second inorganic encapsulation layer 430 may cover the display region DA and may extend outside the first dam 510.

The organic encapsulation layer 420 may be disposed on the first inorganic encapsulation layer 410 and may cover the display region DA. The organic encapsulation layer 420 may create a step around the first inorganic encapsulation layer 410 and may have a substantially flat upper surface.

In an embodiments, the organic encapsulation layer 420 may be formed by an inkjet process using an organic material such as a transparent monomer. In such an embodiment, when an amount of the organic material is large or a discharge position of the organic material is biased toward an outer side (e.g., the first direction DR1) of the substrate 100, an overflow phenomenon in which the organic matter overflows to the outside of the first dam 510 or the second dam 520 may occur. In contrast, when the amount of the organic material is small or the discharge position of the organic material is biased in a direction opposite to the first direction DR1, the organic encapsulation layer 420 may not cover a portion of the display region DA or cracks may occur in the first and second inorganic encapsulation layers 410 and 430. Therefore, it is desired to accurately determine and adjust whether or not the organic material is accurately discharged and landed on a target point.

In an embodiment, the organic encapsulation layer 420 may be located inside the first dam 510. In an embodiment, for example, as shown in FIG. 3, an edge 421a of the organic encapsulation layer 420 may be located on the first dam 510.

Alternatively, the edge 421b of the organic encapsulation layer 420 may be located in the first region 1A.

In another alternative embodiment, the organic encapsulation layer 420 may be located outside the first dam 510 and inside the second dam 520. That is, although not shown in FIG. 3, the edge of the organic encapsulation layer 420 may be located in the second region 2A.

In an embodiment of a manufacturing process of the display device 10, as described above, the organic encapsulation layer 420 may be etched after being formed on the first inorganic encapsulation layer 410, the second inorganic encapsulation layer 430 may be formed on the first inorganic encapsulation layer 410 in the first dam region DAM1 and the second dam region DAM2, the first inorganic encapsulation layer 410 may formed on the first dam 510, the second dam 520 spaced from the first dam 510 and formed in the second dam region DAM2, and the light emitting element 300, and the light emitting element 300 may be formed on the organic insulating layer 120. The first dam 510 may be spaced from the organic insulating layer 120 and may be formed in the first dam region DAM1.

In such an embodiment, a first light L1 may be radiated after the second inorganic encapsulation layer 430 is formed for an inspection. Since a light transmittance of the second inorganic encapsulation layer 430 and the organic encapsulation layer 420 are different from each other according to wavelengths, the organic encapsulation layer 420 may be inspected even after the second inorganic encapsulation layer 430 is formed.

In this way, the organic encapsulation layer 420 may be etched not to be disposed on an upper portion of the first dam 510 and an upper portion of the second dam 520. However, after etching the organic encapsulation layer 420, the organic encapsulation layer 420 may remain in the first dam region DAM1 and the second dam region DAM2. Therefore, an embodiment of the inspection method of FIG. 1 may improve a reliability of the display device 10 by inspecting the organic encapsulation layer 420 remaining in the first dam region DAM1 and the second dam region DAM2.

Figure 4:
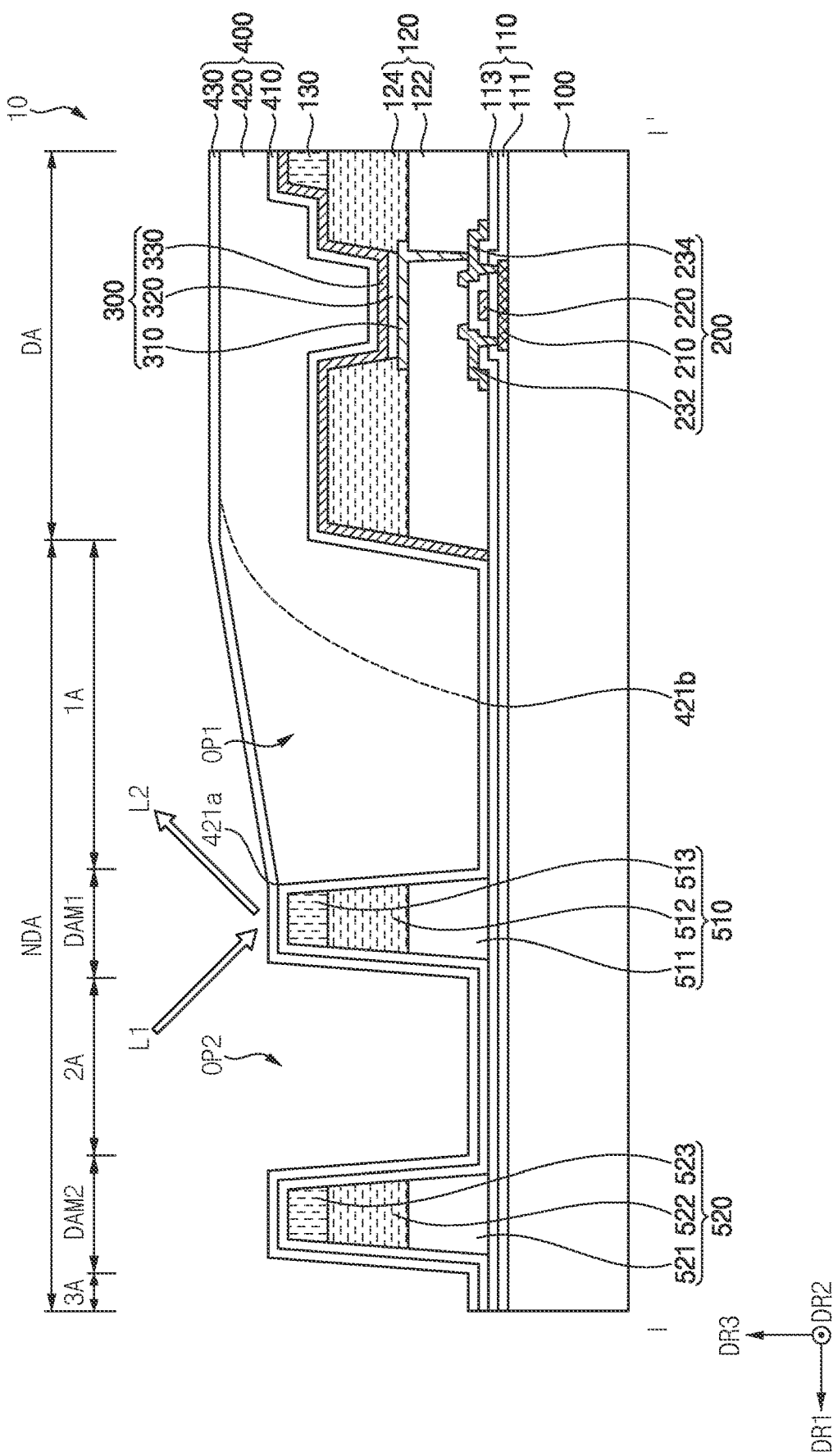
FIGS. 4 and 5 are cross-sectional views taken along line I-I' of FIG. 2, illustrating an example of radiating a first light in the inspection method of FIG. 1.
Figure 5:
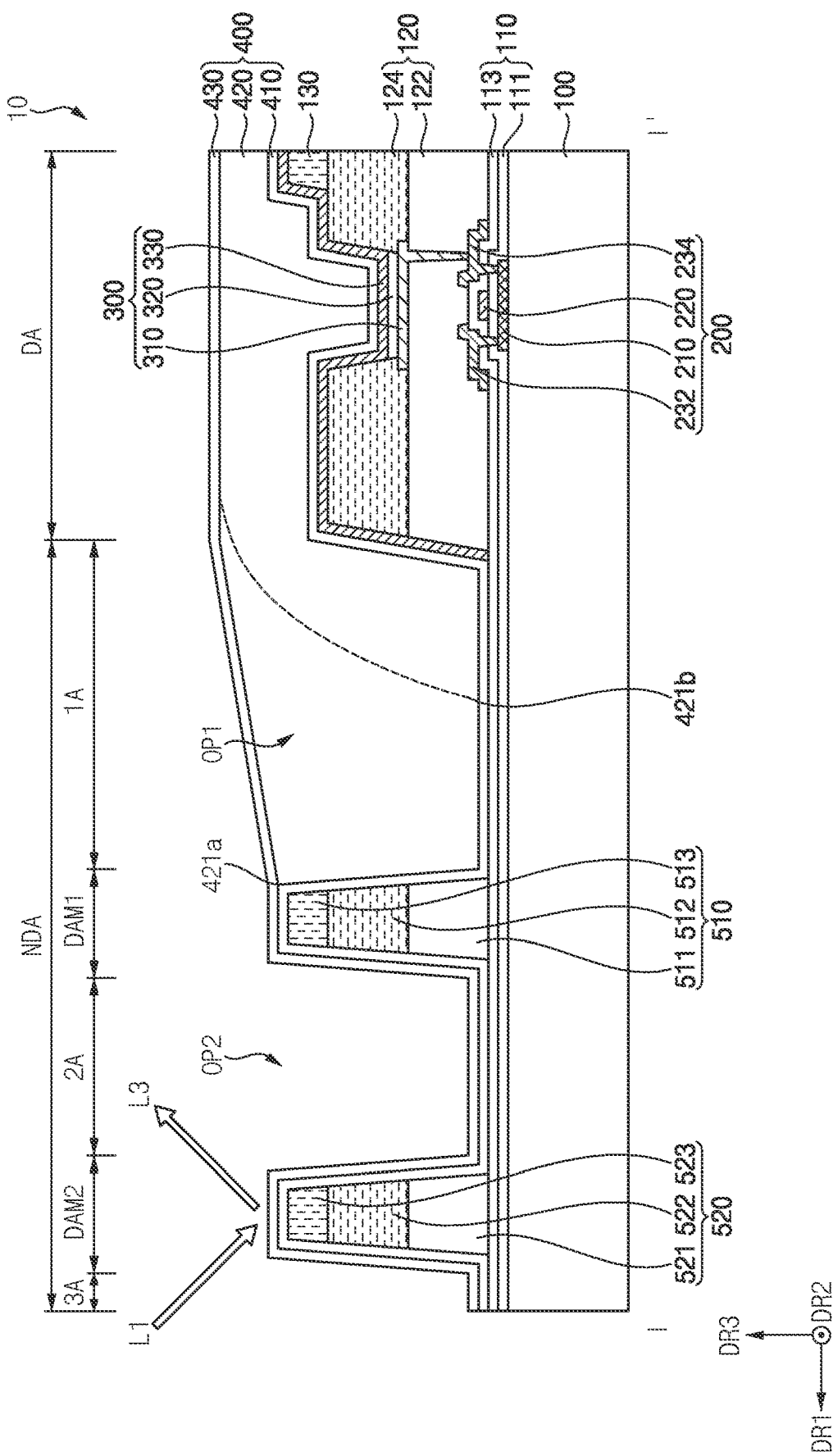
Figure 6:
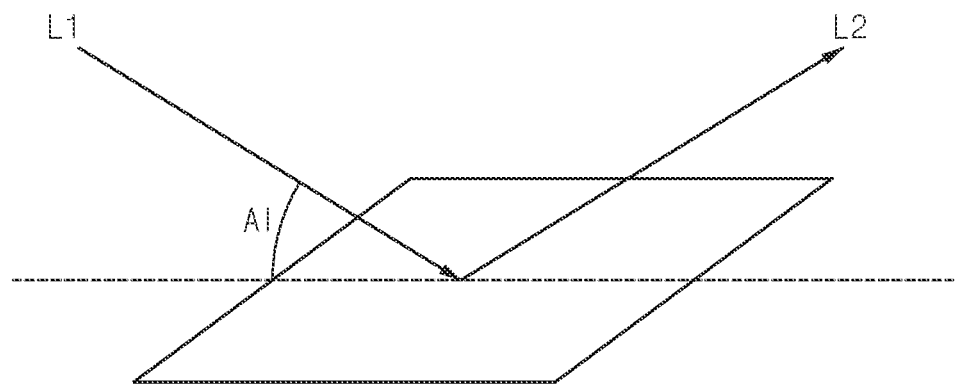
FIG. 6 is a diagram showing an inclination angle of a first light.

FIGS. 4 and 5 are cross-sectional views taken along line I-I' of FIG. 2, illustrating an example of radiating the first light L1 in the inspection method of FIG. 1, and FIG. 6 is a diagram showing an inclination angle AI of the first light L1.

Referring to FIGS. 1, and 4 to 6, an embodiment of the inspection method may include radiating the first light L1 including a light of an radiation wavelength range to the first dam region DAM1 located in the non-display region NDA located outside the display region DA (S100). In an embodiment, the inspection method may include radiating the first light L1 including a light of an radiation wavelength range to the second dam region DAM2 located in the non-display region NDA located outside the display region DA.

The inspection method of FIG. 1 may perform an inspection using a polarized light. That is, the first light L1 may be the polarized light.

The first light L1 may be radiated at an inclination angle AI of about 15° or less. The inspection method of FIG. 1 may be a method of inspecting the organic encapsulation layer 420 remaining in the first dam region DAM1 and/or the second dam region DAM2, where the organic encapsulation layer 420 is formed on an upper of the first inorganic encapsulation layer 410. In addition, interference for the first light L1 of lower layers of the first inorganic encapsulation layer 410 may increase as the inclination angle AI of the first light L1 increases. Accordingly, the interference of lower layers of the first inorganic encapsulation layer 410 may be minimized by limiting the inclination angle AI of the first light L1.

The first light L1 may be radiated at the inclination angle AI of about 10° or greater. When the inclination angle AI of the first light L1 is too small, i.e., less than about 10°, it may be difficult to analyze the irradiated layer. Accordingly, the inclination angle AI of the first light L1 may be limited to about 100 or greater.

The first light L1 may be radiated to local regions of the first dam region DAM1 and the second dam region DAM2. In an embodiment, for example, the first light L1 may be radiated to an region having horizontal and vertical sizes of about 10 micrometers (µm) to about 20 µm.

Figure 7:
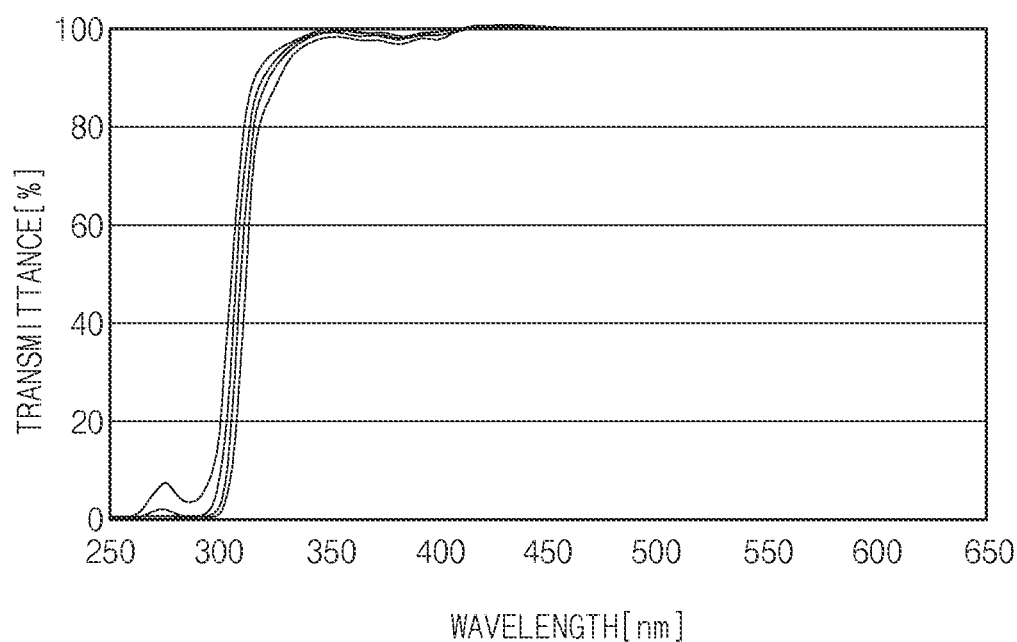
FIG. 7 is a graph showing a transmittance of a light according to a wavelength of a monomer.
Figure 8:
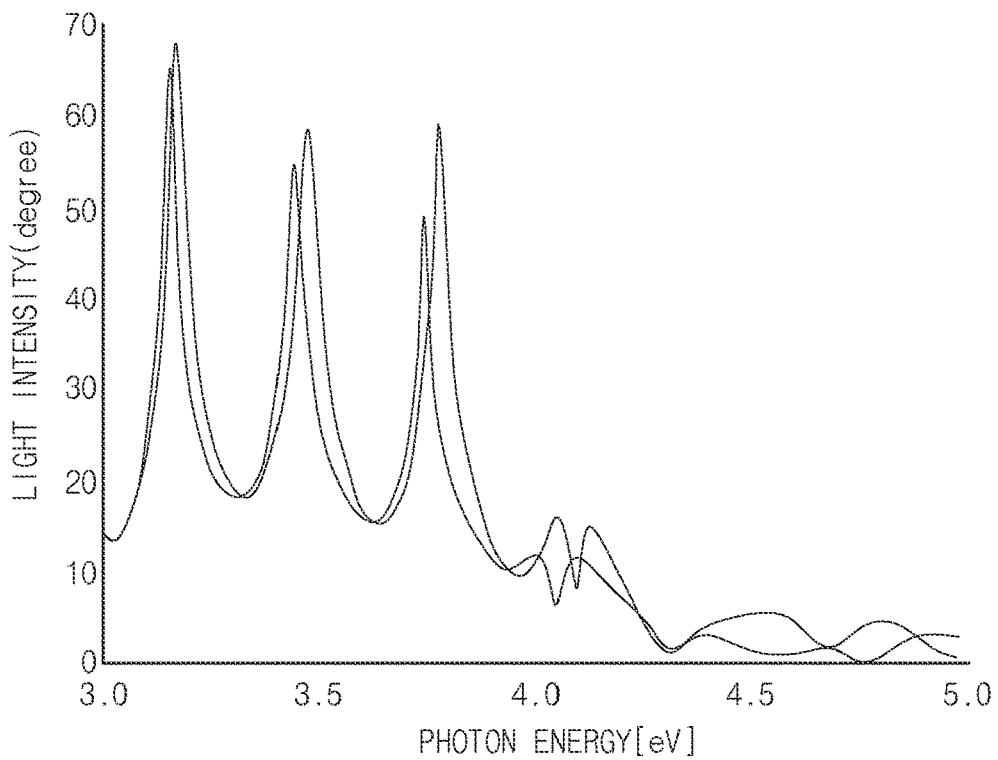
FIG. 8 is a graph showing an a light intensity according to a photon energy of a second light when there is no remaining organic encapsulation layer.
Figure 9:
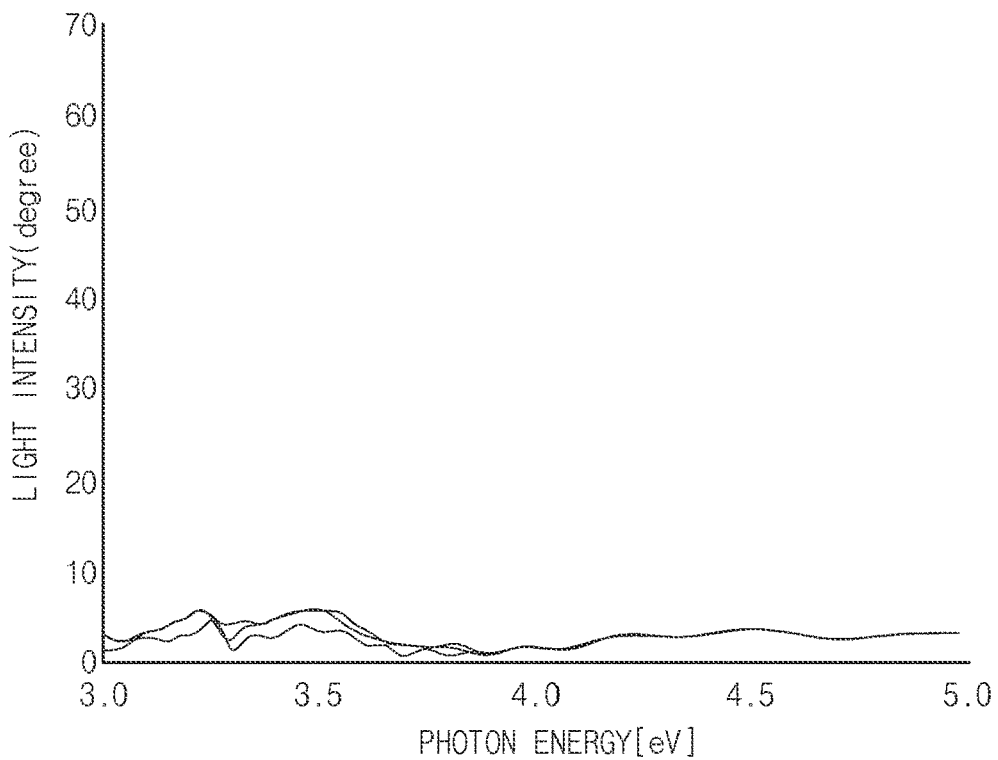
FIG. 9 is a graph showing an a light intensity according to a photon energy of a second light when there is a remaining organic encapsulation layer.

FIG. 7 is a graph showing a transmittance of a light according to a wavelength of the monomer, FIG. 8 is a graph showing an a light intensity according to a photon energy of a second light L2 when there is no remaining organic encapsulation layer, and FIG. 9 is a graph showing an a light intensity according to a photon energy of the second light L2 when there is the remaining organic encapsulation layer. FIGS. 8 and 9 show values measured several times.

The unit of the wavelength may be a nanometer (nm), the unit of the transmittance may be a percentage (%), the unit of the photon energy may be an electron volt (eV), and the light intensity may represent a relative intensity.

Referring to FIGS. 1, 4, 5, and, 7 to 9, an embodiment of the inspecting method may include receiving the second light L2 reflected from the first dam region DAM1 (S200), and analyzing the radiation wavelength range of the second light L2 to inspect the organic encapsulation layer 420 remaining in the first dam region DAM1 after etching the organic encapsulation layer 420 (S300). In such an embodiment, the second light L2 is a light reflected from the first dam region DAM1 when radiating the first light L1 to the first dam region DAM1.

The radiation wavelength range of the first light L1 may include an ultraviolet ray wavelength range. In an embodiment, for example, the radiation wavelength range may be about 290 nm or greater. In an embodiment, for example, the radiation wavelength range may be about 410 nm or less.

As described above, the organic encapsulation layer 420 may be formed using the monomer. As shown in FIG. 7, the monomer may absorb a light in an ultraviolet wavelength range (e.g., a wavelength range of about 290 nm to about 410 nm). That is, in a case where the organic encapsulation layer 420 remains in the first dam region DAM1, the light intensity of the second light L2 may be relatively weak in the ultraviolet wavelength range compared to the first light L1. Therefore, in the inspection method of FIG. 1, the organic encapsulation layer 420 remaining in the first dam region DAM1 after etching the organic encapsulation layer 420 may be inspected by analyzing the radiation wavelength range of the second light L2.

In an embodiment, for example, when the light intensity of the second light L2 in the radiation wavelength range is greater than a preset reference intensity, it may be determined that the organic encapsulation layer 420 remaining in the first dam region DAM1 exists. In an embodiment, for example, when an average of the light intensity of the second light L2 in the radiation wavelength range is greater than a preset reference average, it is determined that the organic encapsulation layer 420 remaining in the first dam region DAM1 exists.

In an embodiment, the inspection method of FIG. 1 may include receiving the third light L3 reflected the second dam region DAM2, and analyzing the radiation wavelength range of the third light L3 to inspect the organic encapsulation layer 420 remaining in the second dam region DAM2 after etching the organic encapsulation layer 420.

As described above, the organic encapsulation layer 420 may be formed using the monomer. As shown in FIG. 7, the monomer may absorb the light in the ultraviolet wavelength range (e.g., the wavelength range of about 290 nm to about 410 nm). That is, when the organic encapsulation layer 420 remains in the second dam region DAM2, the light intensity of the third light L3 may be relatively weak in the ultraviolet wavelength range compared to the first light L1. Therefore, in the inspection method, the organic encapsulation layer 420 remaining in the second dam region DAM2 after etching the organic encapsulation layer 420 may be inspected by analyzing the radiation wavelength range of the third light L3.

In an embodiment, for example, when the light intensity of the third light L3 in the radiation wavelength range is greater than a preset reference intensity, it may be determined that the organic encapsulation layer 420 remaining in the second dam region DAM2 exists. In an embodiment, for example, when an average of the light intensity of the third light L3 in the radiation wavelength range is greater than a preset reference average, it is determined that the organic encapsulation layer 420 remaining in the second dam region DAM2 exists.

Figure 10:
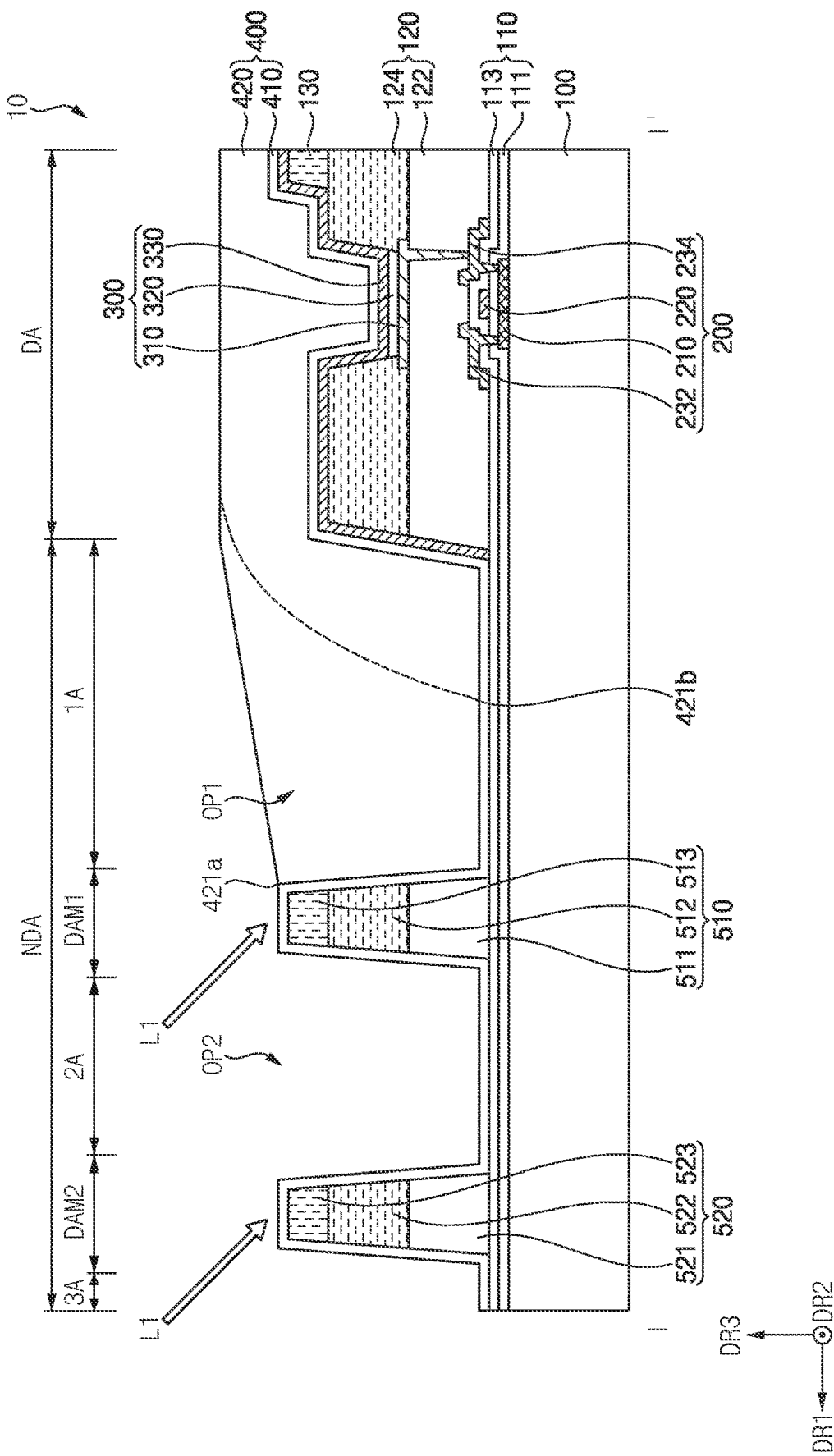
FIG. 10 is a cross-sectional view taken along line I-I' of FIG. 2, illustrating an example of radiating a first light in an inspection method for a display device according to embodiments of the invention.

FIG. 10 is a cross-sectional view taken along line I-I' of FIG. 2, illustrating an example of radiating the first light L1 in an inspection method for a display device according to embodiments of the invention.

The inspection method for the display device shown in FIG. 10 is substantially the same as the inspection method of FIG. 1 except for timing at which the first light L1 is radiated. Thus, the same reference numerals are used to refer to the same or similar elements, and any repetitive detailed description thereof will be omitted.

Referring to FIG. 10, according to an embodiment of the inspection method, the first light L1 may be radiated after etching the organic encapsulation layer 420. Therefore, the inspection method of FIG. 10 may more accurately inspect the organic encapsulation layer 420 than after the second inorganic encapsulation layer 430 is formed.

Figure 11:
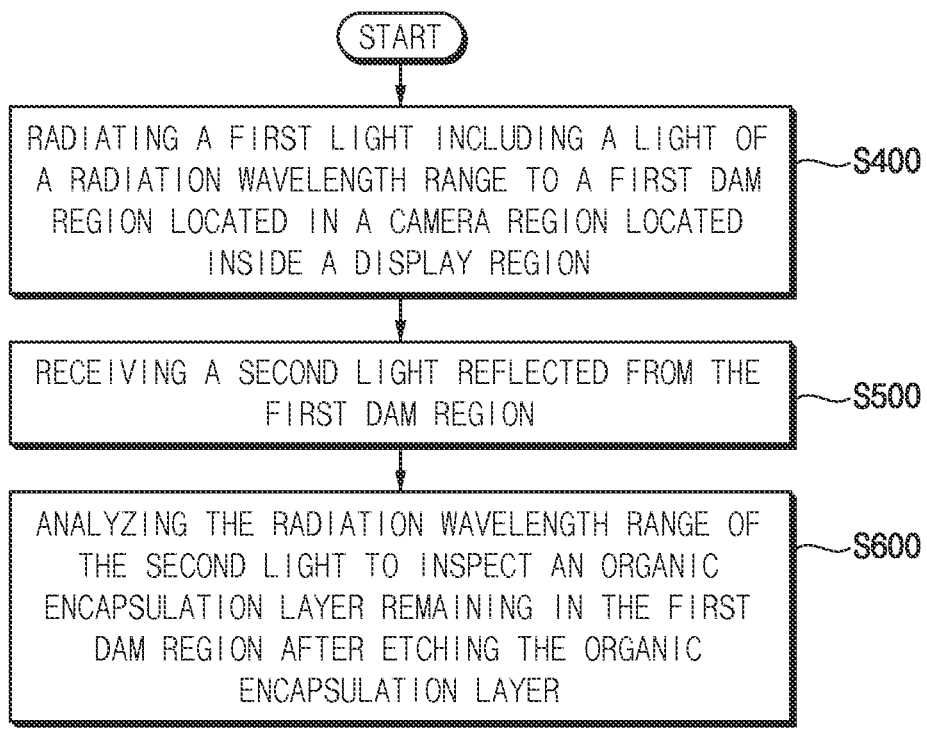
FIG. 11 is a flowchart illustrating an inspection method for a display device according to embodiments of the invention.
Figure 12:
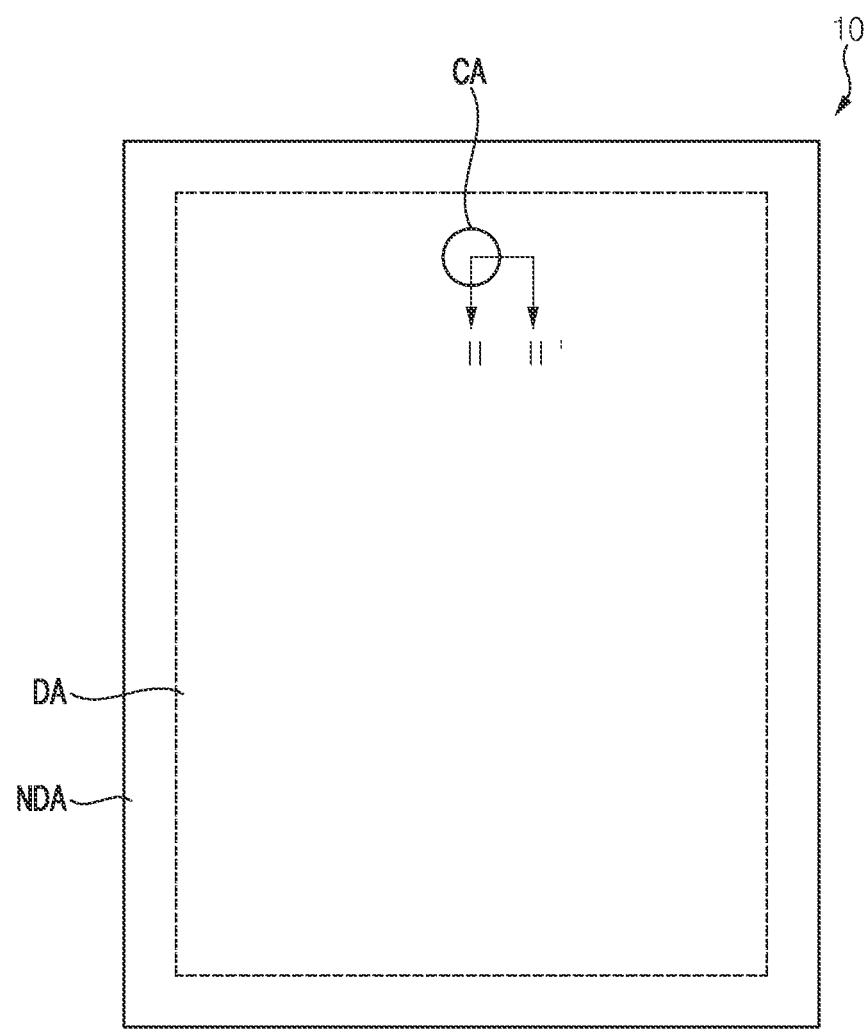
FIG. 12 is a plan view illustrating an embodiment of a display device subject to the inspection method of FIG. 11.
Figure 13:
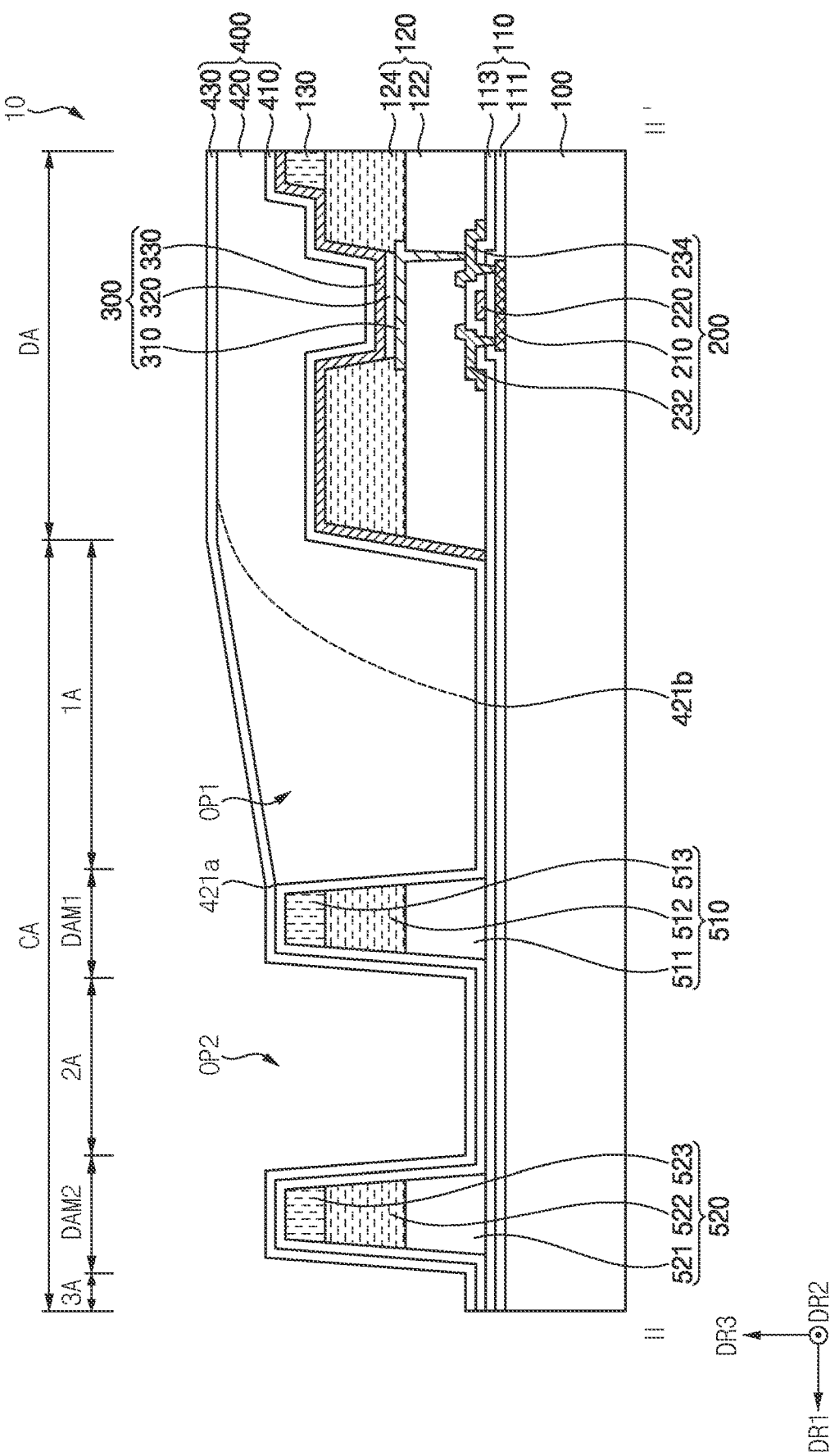
FIG. 13 is a cross-sectional view taken along line II-II' of FIG. 12.

FIG. 11 is a flowchart illustrating an inspection method for a display device according to embodiments of the invention, FIG. 12 is a plan view illustrating an embodiment of a display device subject to the inspection method of FIG. 11, and FIG. 13 is a cross-sectional view taken along line II-II' of FIG. 12.

The inspection method of FIGS. 11 to 13 is substantially the same as the inspection method of FIG. 1 except for an inspection region. Thus, the same reference numerals are used to refer to the same or similar elements, and any repetitive detailed description thereof will be omitted.

Referring to FIG. 11, an embodiment of the inspecting method may include radiating the first light including a light of the radiation wavelength range to the first dam region located in the camera region located inside the display region (S400), receiving the second light reflected from the first dam region (S500), and analyzing the radiation wavelength range of the second light to inspect the organic encapsulation layer remaining in the first dam region after etching the organic encapsulation layer (S600).

In an embodiment, the inspection method may further include radiating the first light the a second dam region spaced from the first dam region, receiving the third light reflected from the second dam region, and analyzing the radiation wavelength range of the third light to inspect the organic encapsulation layer remaining in the second dam region after etching the organic encapsulation layer.

That is, the inspecting method of FIG. 11 may inspect the organic encapsulation layer remaining in the first dam region and/or the second dam region in the camera region.

Referring to FIGS. 11 to 13, since a structure of the camera region CA is substantially the same as a structure of the non-display region NDA of FIG. 3, any repetitive detailed description of the same or similar elements of the camera region CA shown in FIGS. 11 to 13 as those of the non-display region NDA described above will be omitted.

Figure 14:
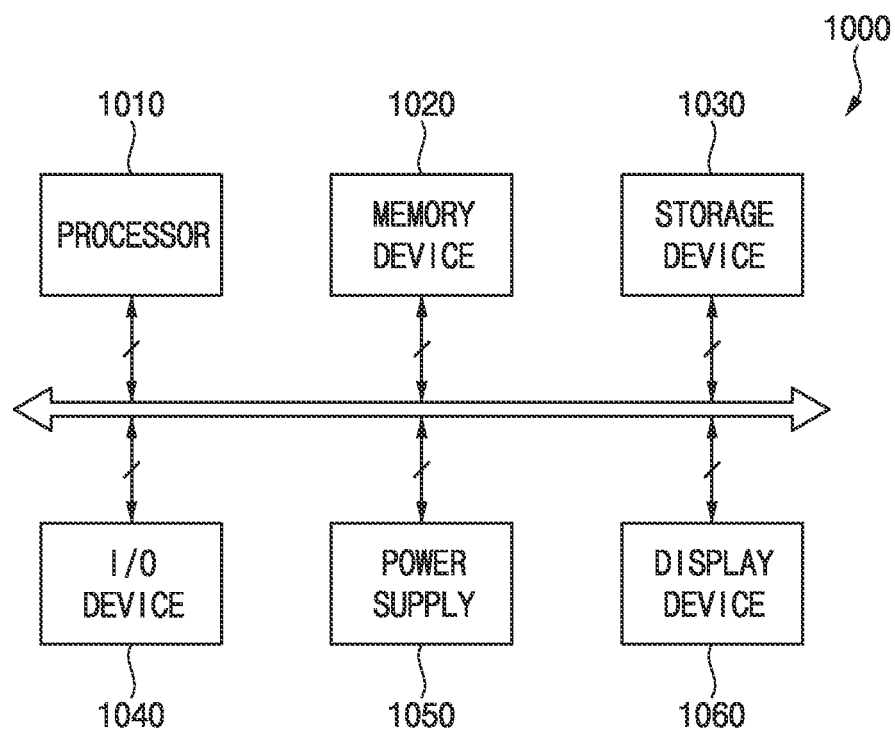
FIG. 14 is a block diagram showing an electronic device according to embodiments of the invention.
Figure 15:
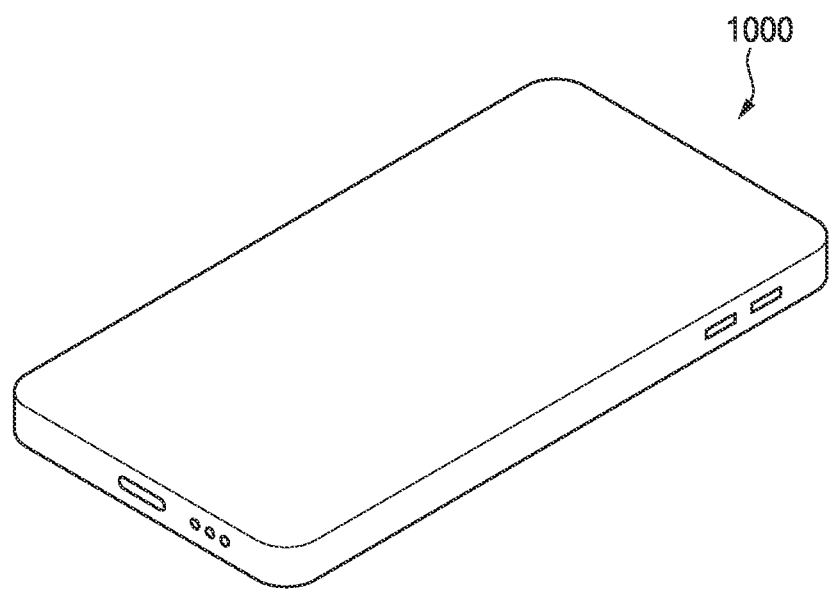
FIG. 15 is a diagram showing an embodiment in which the electronic device of FIG. 14 is implemented as a smart phone.

FIG. 14 is a block diagram showing an electronic device according to embodiments of the invention, and FIG. 15 is a diagram showing an embodiment in which the electronic device of FIG. 14 is implemented as a smart phone.

Referring to FIGS. 14 and 15, an embodiment of the electronic device 1000 may include a processor 1010, a memory device 1020, a storage device 1030, an input/output (I/O) device 1040, a power supply 1050, and a display device 1060. Here, the display device 1060 may be the display device of FIG. 2. In addition, the electronic device 1000 may further include a plurality of ports for communicating with a video card, a sound card, a memory card, a universal serial bus (USB) device, other electronic devices, etc. In an embodiment, as shown in FIG. 14, the electronic device 1000 may be implemented as a smart phone. However, the electronic device 1000 is not limited thereto. In an embodiment, for example, the electronic device 1000 may be implemented as a cellular phone, a video phone, a smart pad, a smart watch, a tablet personal computer (PC), a car navigation system, a computer monitor, a laptop, a head mounted display (HMD) device, etc.

The processor 1010 may perform various computing functions. The processor 1010 may be a micro processor, a central processing unit (CPU), an application processor (AP), etc. The processor 1010 may be coupled to other components via an address bus, a control bus, a data bus, etc. Further, the processor 1010 may be coupled to an extended bus such as a peripheral component interconnection (PCI) bus.

The memory device 1020 may store data for operations of the electronic device 1000. In an embodiment, for example, the memory device 1020 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc.

The storage device 1030 may include a solid state drive (SSD) device, a hard disk drive (HDD) device, a CD-ROM device, etc.

The I/O device 1040 may include an input device such as a keyboard, a keypad, a mouse device, a touch pad, a touch screen, etc., and an output device such as a printer, a speaker, etc. In some embodiments, the I/O device 1040 may include the display device 1060.

The power supply 1050 may provide power for operations of the electronic device 1000. For example, the power supply 1050 may be a power management integrated circuit (PMIC).

The display device 1060 may display an image corresponding to visual information of the electronic device 1000. In an embodiment, for example, the display device 1060 may be an organic light emitting display device or a quantum dot light emitting display device, but is not limited thereto. The display device 1060 may be coupled to other components via the buses or other communication links.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. An inspection method for a display device, the inspection method comprising:
radiating a first light including a light of a radiation wavelength range to a first dam region located in a non-display region of the display device located outside a display region of the display device;
receiving a second light reflected from the first dam region; and
analyzing the radiation wavelength range of the second light to inspect an organic encapsulation layer remaining in the first dam region after etching the organic encapsulation layer.

2. The inspection method of claim 1, wherein the radiation wavelength range is about 290 nm or greater.

3. The inspection method of claim 1, wherein the radiation wavelength range is about 410 nm or less.

4. The inspection method of claim 1, wherein the first light is radiated at an inclination angle of about 15° or less.

5. The inspection method of claim 1, wherein the first light is radiated at an inclination angle of about 10° or greater.

6. The inspection method of claim 1, wherein the first light is radiated after the organic encapsulation layer is etched,
wherein the organic encapsulation layer is etched after being formed on a first inorganic encapsulation layer,
wherein the first inorganic encapsulation layer is formed on a first dam and a light emitting element,
wherein the first dam is spaced from an organic insulating layer and is formed in the first dam region, and
wherein the light emitting element is formed on the organic insulating layer.

7. The inspection method of claim 1, wherein the first light is radiated after a second inorganic encapsulation layer is formed,
wherein the organic encapsulation layer is etched after being formed on a first inorganic encapsulation layer,
wherein the second inorganic encapsulation layer is formed on the first inorganic encapsulation layer in the first dam region,
wherein the first inorganic encapsulation layer is formed on a first dam and a light emitting element,
wherein the first dam is spaced from an organic insulating layer and is formed in the first dam region, and
wherein the light emitting element is formed on the organic insulating layer.

8. The inspection method of claim 1, wherein the first light is a polarized light.

9. The inspection method of claim 1, further comprising:
radiating the first light to a second dam region spaced from the first dam region;
receiving a third light reflected from the second dam region; and
analyzing the radiation wavelength range of the third light to inspect the organic encapsulation layer remaining in the second dam region after etching the organic encapsulation layer.

10. The inspection method of claim 9, wherein the first light is radiated after the organic encapsulation layer is etched,
wherein the organic encapsulation layer is etched after being formed on a first inorganic encapsulation layer,
wherein the first inorganic encapsulation layer is formed on a first dam, a second dam spaced from the first dam, and a light emitting element,
wherein the first dam is spaced from an organic insulating layer and is formed in the first dam region, and
wherein the light emitting element is formed on the organic insulating layer.

11. The inspection method of claim 9, wherein the first light is radiated after a second inorganic encapsulation layer is formed on the organic encapsulation layer,
wherein the organic encapsulation layer is etched after being formed on a first inorganic encapsulation layer,
wherein the second inorganic encapsulation layer is formed on the first inorganic encapsulation layer in the first dam region and the second dam region,
wherein the first inorganic encapsulation layer is formed on a first dam, a second dam spaced from the first dam, and a light emitting element,
wherein the first dam is spaced from an organic insulating layer and is formed in the first dam region, and
wherein the light emitting element is formed on the organic insulating layer.

12. An inspection method for a display device, the inspection method comprising:
radiating a first light including a light of an radiation wavelength range to a first dam region located in a camera region of the display device located inside a display region of the display device;
receiving a second light reflected from the first dam region; and
analyzing the radiation wavelength range of the second light to inspect an organic encapsulation layer remaining in the first dam region after etching the organic encapsulation layer.

13. The inspection method of claim 12, wherein the radiation wavelength range is about 290 nm or greater.

14. The inspection method of claim 12, wherein the radiation wavelength range is about 410 nm or less.

15. The inspection method of claim 12, wherein the first light is radiated at an inclination angle of about 15° or less.

16. The inspection method of claim 12, wherein the first light is radiated at an inclination angle of about 10° or greater.

17. The inspection method of claim 12, wherein the first light is radiated after the organic encapsulation layer is etched,
wherein the organic encapsulation layer is etched after being formed on a first inorganic encapsulation layer, wherein the first inorganic encapsulation layer is formed on a first dam and a light emitting element,
wherein the first dam is spaced from an organic insulating layer and is formed in the first dam region, and
wherein the light emitting element is formed on the organic insulating layer.

18. The inspection method of claim 12, wherein the first light is radiated after a second inorganic encapsulation layer is formed on the organic encapsulation layer,
wherein the organic encapsulation layer is etched after being formed on a first inorganic encapsulation layer,
wherein the second inorganic encapsulation layer is formed on the first inorganic encapsulation layer in the first dam region,
wherein the first inorganic encapsulation layer is formed on a first dam and a light emitting element,
wherein the first dam is spaced from an organic insulating layer and is formed in the first dam region, and
wherein the light emitting element is formed on the organic insulating layer.

19. The inspection method of claim 12, further comprising:
radiating the first light to a second dam region spaced from the first dam region;
receiving a third light reflected from the second dam region; and
analyzing the radiation wavelength range of the third light to inspect the organic encapsulation layer remaining in the second dam region after etching the organic encapsulation layer.

20. An electronic device comprising:
a display device including a display region and a non-display region outside the display region, the non-display region including a dam region; and
a processor configured to perform computing functions for the display device,
wherein the display device is configured to be inspected by an inspection method comprising:
radiating a first light including a light of a radiation wavelength range to the dam region of the display device;
receiving a second light reflected from the dam region; and
analyzing the radiation wavelength range of the second light to inspect an organic encapsulation layer remaining in the dam region after etching the organic encapsulation layer.

* * * * *